United States Patent
Lim (10) Patent No.: US 9,025,712 B2
(45) Date of Patent: May 5, 2015

(54) SENSOR, CLOCK FREQUENCY ADJUSTING SYSTEM AND METHOD THEREOF

(71) Applicant: Pixart Imaging Inc., Hsin-Chu (TW)

(72) Inventor: Kevin Len-Li Lim, Pulau Pinang (MY)

(73) Assignee: Pixart Imaging Inc., Hsin-Chu (TW)

( * ) Notice: Subject to any disclaimer, the term of this patent is extended or adjusted under 35 U.S.C. 154(b) by 148 days.

(21) Appl. No.: 13/953,800

(22) Filed: Jul. 30, 2013

(65) Prior Publication Data

US 2015/0035754 A1 Feb. 5, 2015

(51) Int. Cl.
*H04L 7/00* (2006.01)
*G06F 3/0354* (2013.01)
*H03L 7/00* (2006.01)

(52) U.S. Cl.
CPC ............. *G06F 3/03543* (2013.01); *H03L 7/00* (2013.01)

(58) Field of Classification Search
CPC ..... H03L 7/00; H03L 7/02; H03L 7/16–7/235
USPC .......... 375/354, 377; 327/141, 151, 154, 160, 327/162; 345/163, 165, 166, 170
See application file for complete search history.

(56) References Cited

U.S. PATENT DOCUMENTS

| | | | |
|---|---|---|---|
| 7,046,097 B2 * | 5/2006 | Kappes et al. | 331/135 |
| 8,643,410 B1 * | 2/2014 | Bhargava et al. | 327/141 |
| 2007/0079166 A1 * | 4/2007 | Okada et al. | 713/500 |

\* cited by examiner

*Primary Examiner* — Dac Ha
(74) *Attorney, Agent, or Firm* — Li & Cai Intellectual Property (USA) Office (57) ABSTRACT

A clock frequency adjusting system is disclosed. The clock frequency adjusting system includes a sensing clock generating unit, a frequency-dividing unit and a controller. The frequency-dividing unit makes frequency of the sensing clock signal be divided by a frequency-dividing modulus and then outputs a clock calibration signal. The controller includes a period counter and a frequency adjusting unit. The period counter samples the clock calibration signal through the external clock signal so as to acquire a second count value. The frequency adjusting unit calculates a frequency difference data between the clock calibration signal and the predetermined clock signal according to the first count value and the second count value, and determines a number of adjustment according to the frequency difference data and a step adjusting frequency so as to output a clock adjusting signal to the sensing clock unit to adjust frequency of the sensing clock signal.

20 Claims, 4 Drawing Sheets

SENSOR, CLOCK FREQUENCY ADJUSTING SYSTEM AND METHOD THEREOF

BACKGROUND OF THE INVENTION

1. Field of the Invention

The instant disclosure relates to a sensor in a mouse; in particular, to the sensor utilizing an external clock frequency to automatically adjust internal clock frequency.

2. Description of Related Art

An optical mouse sensor captures images at a certain frame rate and computes the displacement between images through image comparison. The frame rate is determined by a master clock that is typically generated internally in the sensor. The frequency of the internal clock source will vary over process, voltage and temperature variation. Since the logic circuit that determines the frame rate is driven by the same clock source, the frame rate will also vary in the same way. The internal clock source variation can be as large as +/−20%.

The performance of the mouse is sensitive to frame rate. Two examples of such performance parameters are maximum speed and maximum acceleration. The maximum speed and acceleration of a mouse increases as its frame rate increases. Therefore, to guarantee that a mouse is able to meet a given speed and/or acceleration specification, the variation of the internal clock source needs to be taken into account. For example:

Let the specification be 10 ips maximum speed and 1 g maximum acceleration.

To meet the specification, let the minimum frame rate be 1000 fps (frames per second).

Given a nominal clock frequency of 10 MHz and a +/−20% clock frequency variation, the min-typ-max clock frequency is 8-10-12 MHz.

In order to meet the speed and acceleration specification over the range of clock frequency variation, we need to set the minimum frame rate i.e. the frame rate at 8 MHz to be 1000 fps.

Therefore, the min-typ-max frame rate is 1000-1200-1440 fps, given the min-typ-max clock frequency of 8-10-12 MHz.

In the example above, we can guarantee that, despite variation in clock frequency, any given mouse will meet the 10 ips and 1 g specification because the frame rate is designed to >1000 fps over the clock frequency variation.

However, power consumption increases almost linearly with frame rate. Therefore, sensors with a frame rate above 1000 fps consume more power than what is needed to minimally meet the 10 ips and 1 g specification.

SUMMARY OF THE INVENTION

The instant disclosure provides a clock frequency adjusting system. The clock frequency adjusting system includes a sensing clock generating unit, a frequency-dividing unit and a controller. The sensing clock generating unit generates a sensing clock signal. The frequency-dividing unit is electrically connected to the sensing clock generating unit and the frequency-dividing unit receives the sensing clock signal and makes frequency of the sensing clock signal be divided by a frequency-dividing modulus and then outputs a clock calibration signal, wherein the frequency-dividing modulus is a positive integer. The controller is electrically connected to the frequency-dividing unit. The controller haves a first count value, wherein the first count value is equal to frequency of an external clock signal divided by frequency of a predetermined clock signal. The controller includes a period counter and a frequency adjusting unit. The period counter is electrically connected to the frequency-dividing unit and the period counter receives the external clock signal and the clock calibration signal, and samples the clock calibration signal through the external clock signal so as to acquire a second count value. The frequency adjusting unit is electrically connected to the period counter and the frequency adjusting unit calculates a frequency difference data between the clock calibration signal and the predetermined clock signal according to the first count value and the second count value, and determines a number of adjustment according to the frequency difference data and a step adjusting frequency so as to output a clock adjusting signal to the sensing clock unit to adjust frequency of the sensing clock signal.

In an embodiment of the present invention, wherein the frequency adjusting unit is configured to subtract reciprocal of the second count value from reciprocal of the first count value and then make the result be multiplied by the frequency-dividing modulus so as to acquire the frequency difference data, and makes frequency of the external clock signal be divided by the step adjusting frequency so as to acquire a step adjusting data.

In an embodiment of the present invention, wherein the frequency adjusting unit makes the frequency difference data be multiplied by the step adjusting data so as to acquire the number of adjustment, wherein the number of adjustment is a positive integer.

In an embodiment of the present invention, wherein the frequency adjusting unit transmits the clock adjusting signal to the sensing clock generating unit so as to once adjust frequency of the sensing clock signal according to the frequency difference data and the step adjusting frequency.

In an embodiment of the present invention, wherein the frequency adjusting unit transmits the clock adjusting signal to the sensing clock generating unit so as to gradually adjust frequency of the sensing clock signal according to the number of adjustment and the step adjusting frequency.

In an embodiment of the present invention, wherein the second count value is equal to frequency of an external clock signal divided by frequency of the clock calibration signal.

In an embodiment of the present invention, wherein the controller further comprises a programmable memory unit. The programmable memory unit is electrically connected to the frequency adjusting unit and the programmable memory unit is configured to store at least one of the final clock adjusting signal, the frequency-dividing modulus, the first count value, the step adjusting frequency and the number of adjustment.

In an embodiment of the present invention, the clock frequency adjusting system further comprises an image capture unit. The image capture unit is electrically connected to the sensing clock generating unit, and the image capture unit receives the sensing clock signal and accordingly captures a surface image, wherein the image capture unit has a predetermined frame rate, and the predetermined frame rate is corresponding to frequency of the predetermined clock signal.

The instant disclosure another provides a sensor used for a mouse. The sensor includes a sensing clock generating unit, a frequency-dividing unit and an image capture unit. The sensing clock generating unit generates a sensing clock signal. The frequency-dividing unit is electrically connected to the sensing clock generating unit and the frequency-dividing unit receives the sensing clock signal and makes frequency of the sensing clock signal divided by a frequency-dividing modulus and then outputs a clock calibration signal, wherein the frequency-dividing modulus is a positive integer. The image capture unit is electrically connected to the sensing clock generating unit and the image capture unit receives the sensing clock signal and accordingly captures a surface image, wherein the image capture unit has a predetermined frame rate, and the predetermined frame rate is corresponding to frequency of the predetermined clock signal. The frequency-dividing unit is electrically connected to a controller, the controller has a first count value, and the first count value is equal to frequency of an external clock signal divided by frequency of a predetermined clock signal. The controller includes a period counter and a frequency adjusting unit. The period counter is electrically connected to the frequency-dividing unit and the period counter receives the external clock signal and the clock calibration signal, and samples the clock calibration signal through the external clock signal so as to acquire a second count value. The frequency adjusting unit is electrically connected to the period counter and the frequency adjusting unit calculates a frequency difference data between the clock calibration signal and the predetermined clock signal according to the first count value and the second count value, and determines a number of adjustment according to the frequency difference data and a step adjusting frequency so as to output a clock adjusting signal to the sensing clock unit to adjust frequency of the sensing clock signal.

The instant disclosure another provides a clock frequency adjusting method used for a clock frequency adjusting system. The clock frequency adjusting system includes a sensing clock generating unit, a frequency-dividing unit and a controller. The controller includes a period counter and a frequency adjusting unit. The frequency-dividing unit is electrically connected to the sensing clock generating unit. The period counter is electrically connected to the frequency-dividing unit, and the frequency adjusting unit is connected to the period counter. The clock frequency adjusting method includes steps as follows: generating a sensing clock signal; receiving the sensing clock signal and making frequency of the sensing clock signal be divided by a frequency-dividing modulus and then outputting a clock calibration signal, wherein the frequency-dividing modulus is a positive integer; receiving an external clock signal and the clock calibration signal and sampling the clock calibration signal through the external clock signal so as to acquire a second count value; calculating a frequency difference data between the clock calibration signal and the predetermined clock signal according to the first count value and the second count value, wherein the first count value is equal to frequency of an external clock signal divided by frequency of a predetermined clock signal; determining a number of adjustment according to the frequency difference data and a step adjusting frequency; and outputting a clock adjusting signal to the sensing clock unit to adjust frequency of the sensing clock signal according to number of adjustment.

In an embodiment of the present invention, the frequency adjusting unit makes the frequency difference data be multiplied by the step adjusting data so as to acquire the number of adjustment, wherein the number of adjustment is a positive integer.

In an embodiment of the present invention, the frequency adjusting unit transmits the clock adjusting signal to the sensing clock generating unit so as to adjust frequency of the sensing clock signal according to the frequency difference data and the step adjusting frequency.

In an embodiment of the present invention, the frequency adjusting unit transmits the clock adjusting signal to the sensing clock generating unit so as to adjust frequency of the sensing clock signal according to the number of adjustment and the step adjusting frequency.

To sum up, the clock frequency adjusting system and the method thereof, the sensor are able to automatically adjust internal frequency of the sensor through an external clock frequency so as to meet a predetermined frame rate corresponding to design specification, and then effectively reduce power consumption of the mouse.

For further understanding of the present invention, reference is made to the following detailed description illustrating the embodiments and examples of the present invention. The description is only for illustrating the present invention, not for limiting the scope of the claim.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

[One Embodiment of the Clock Frequency Adjusting System]

Generally speaking, the performance of the mouse is sensitive to frame rate, and two examples of such performance parameters are maximum speed and maximum acceleration. The maximum speed and acceleration of the optical mouse increases as its frame rate increases. A sensor of the optical mouse captures images at a certain frame rate and computes the displacement between two images through image comparison, wherein the frame rate is determined by a frequency of a sensing clock signal generated from the sensor. The clock frequency of the sensor will vary over process, voltage and temperature variation. Moreover, since the logic circuit that determines the frame rate is driven by the same sensing clock signal, the frame rate will also vary in the same way. The internal clock source variation can be as large as +/−20%, and thus the instant disclosure provides a solution for stabilize the frame through automatically adjusting the frequency of sensing clock signal.

Figure 1:
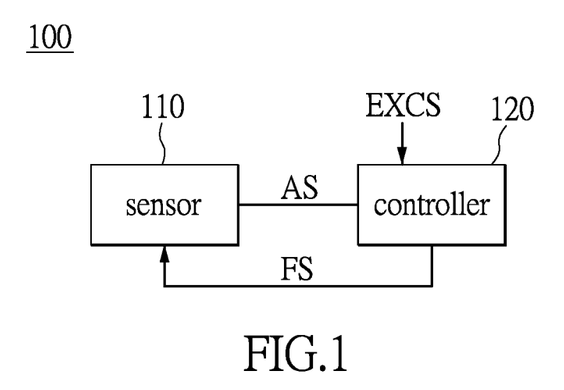
FIG. 1 shows a block schematic view of the clock frequency adjusting system according to an embodiment of the instant disclosure.

Referring to FIG. 1, FIG. 1 shows a block schematic view of the clock frequency adjusting system according to an embodiment of the instant disclosure. The clock frequency adjusting system 100 includes a sensor 110 and a controller 120. The controller 120 is electrically connected to the sensor, wherein the sensor is disposed in an optical mouse (not shown in FIG. 1), and the controller 120 is disposed outside the optical mouse and the controller 120 receives an external clock signal EXCS. The sensor 110 of the optical mouse in the instant disclosure downward frequency of the sensing clock signal generated to the clock calibration signal AS, and transmits the clock calibration signal AS to the controller 120. Afterwards, the controller 120 counts the clock calibration signal AS with an external clock signal EXCS received, wherein a frequency of the external clock signal EXCS is larger than a frequency of the clock calibration signal AS. Next, the controller 120 proceed the calculation according to an algorithm for adjusting clock frequency, and then the controller 120 transmits a clock adjusting signal FS to the sensor 110 so as to once or gradually adjust the frequency of the sensing clock signal generated from the sensor 110 internally.

For a specific instruction on an operation process of the clock frequency adjusting system 100 of the instant disclosure, there is at least one of the embodiments for further instruction.

In the following embodiments, there are only parts different from embodiments in FIG. 1 described, and the omitted parts are indicated to be identical to the embodiments in FIG. 1. In addition, for an easy instruction, similar reference numbers or symbols refer to elements alike.

[Another Embodiment of the Clock Frequency Adjusting System]

Figure 2:
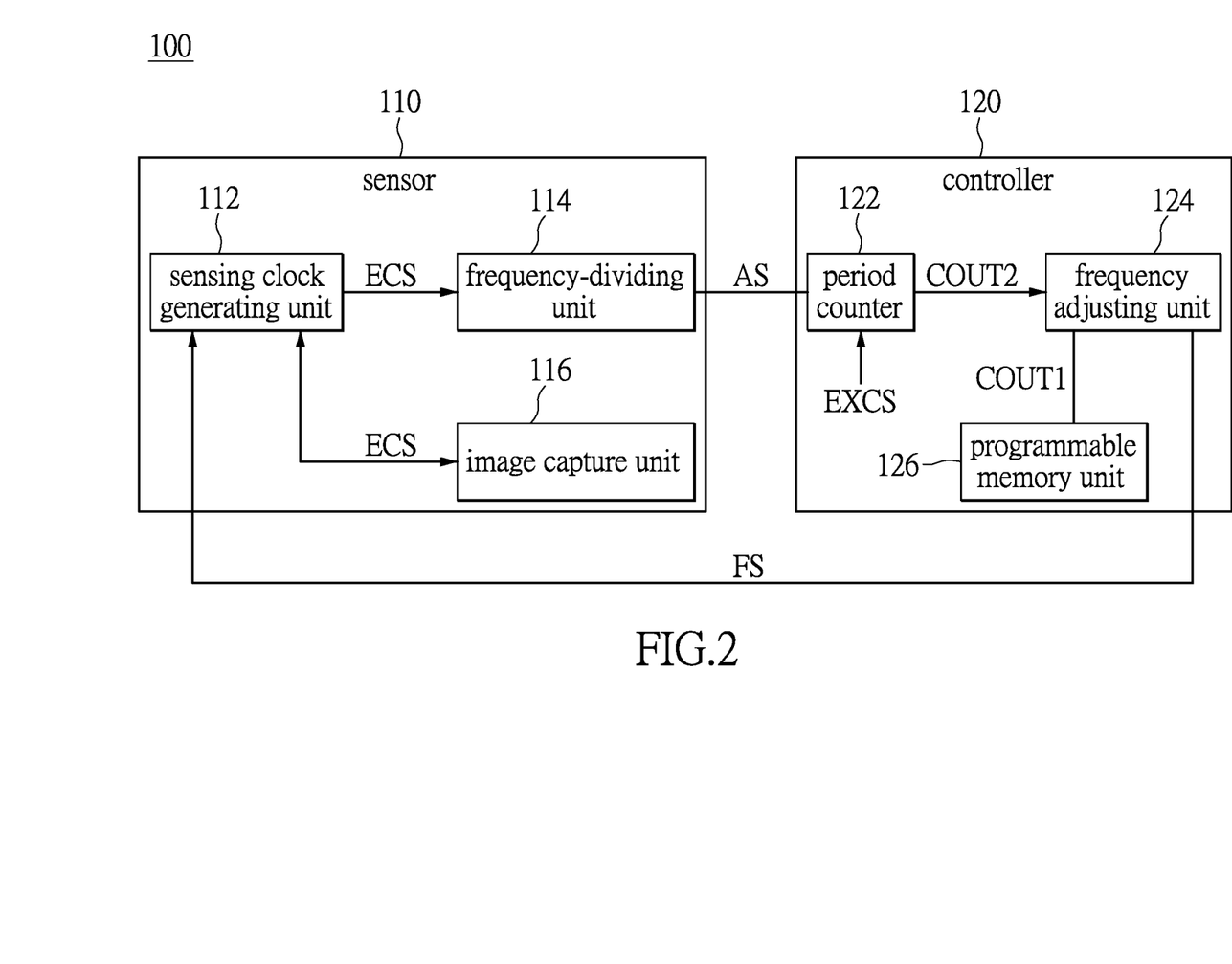
FIG. 2 shows a block schematic view of the clock frequency adjusting system according to another embodiment of the instant disclosure.

Referring to FIG. 2, FIG. 2 shows a block schematic view of the clock frequency adjusting system according to another embodiment of the instant disclosure. The sensor 110 of the clock frequency adjusting system 100 includes a sensing clock generating unit 112, a frequency-dividing unit 114 and an image capture unit 116. The controller 120 of the clock frequency adjusting system 100 includes a period counter 122, a frequency adjusting unit 124 and a programmable memory unit 126. In this embodiment, the sensing clock generating unit 112 may generate a sensing clock signal ECS, a frequency of the sensing clock signal ECS may different from or equal to a target clock signal, therefore the clock frequency adjusting system 100 of the instant disclosure may automatically adjust the frequency of the sensing clock signal ECS through detecting and calibrating mechanism periodically. The frequency-dividing unit 114 is electrically connected to the sensing clock generating unit 112, and the frequency-dividing unit 114 receives the sensing clock signal ECS and downwards the frequency of the sensing clock signal ECS; which means, the frequency-dividing unit 114 makes frequency of the sensing clock signal ECS be divided by a frequency-dividing modulus and then outputs a clock calibration signal AS, wherein the frequency-dividing modulus is a positive integer. The controller 120 has a first count value COUT1, which is stored in the programmable memory unit 126, wherein the first count value COUT1 is equal to frequency of the external clock signal EXCS divided by frequency of a predetermined clock signal. The period counter 122 is electrically connected to the frequency-dividing unit 114 and the period counter 122 receives the external clock signal EXCS and the clock calibration signal AS and samples the clock calibration signal AS with the external clock signal EXCS so as to acquire a second value COUT1, and then the second count value COUT2 is transmitted to the frequency adjusting unit 124. Furthermore, the second count value COUT2 is equal to frequency of the external clock signal EXCS divided by frequency of the clock calibration signal AS.

The frequency adjusting unit 124 is electrically connected to the period counter 122. The frequency adjusting unit 124 receives the second count value COUT2 transmitted from the period counter 122 and gets a first count value COUT1 from the programmable memory unit 126, and then the frequency adjusting unit 124 calculates a frequency difference data between the clock calibration signal AS and a predetermined clock signal according to the first count value COUT1 and the second count value COUT1. Afterwards, the frequency adjusting unit 124 determines a number of adjustment according to the frequency difference data and a step adjusting frequency so as to output a clock adjusting signal FS to the sensing clock unit 112 to adjust frequency of the sensing clock signal ECS. Furthermore, the frequency adjusting unit 124 is configured to subtract reciprocal of the second count value COUT2 from reciprocal of the first count value COUT1 and then make the result be multiplied by the frequency-dividing modulus so as to acquire the frequency difference data, and the frequency adjusting unit 124 makes frequency of the external clock signal EXCS be divided by the step adjusting frequency so as to acquire a step adjusting data. The frequency adjusting unit 124 makes the frequency difference data be multiplied by the step adjusting data so as to acquire the number of adjustment, wherein the number of adjustment is a positive integer. It is worth mentioning that, in one embodiment, the frequency adjusting unit 124 transmits the clock adjusting signal FS to the sensing clock generating unit 112 so as to once adjust frequency of the sensing clock signal ECS according to the frequency difference data and the step adjusting frequency, and thus the frequency of the sensing clock signal ECS is approach to or equal to the frequency of the target clock signal. However, in another embodiment, the frequency adjusting unit 124 transmits the clock adjusting signal FS to the sensing clock generating unit 112 so as to gradually adjust frequency of the sensing clock signal ECS according to the number of adjustment and the step adjusting frequency, and thus the frequency of the sensing clock signal ECS is approach to or equal to the frequency of the target clock signal.

The image capture unit 116 is electrically connected to the sensing clock unit 112. The image capture unit 116 receives the sensing clock signal ECS and accordingly captures a surface image, wherein the image capture unit 116 has a predetermined frame rate and the predetermined frame rate is corresponding to frequency of the predetermined clock signal. It is worth mentioning that frequency of the sensing clock signal ECS generated from the sensing clock unit 112 may generates variation from frequency of the target clock signal because of a process, a voltage or a temperature. The programmable memory unit 126 is electrically connected to the frequency adjusting unit 124. The programmable memory unit 126 may be an EPROM or an EEPROM. In this embodiment, the programmable memory unit 126 stores frequency-dividing modulus, the first count value, the step adjusting frequency and the number of adjustment.

For further understanding of the instant disclosure, a quantization embodiment is described below. Assume the step adjusting frequency is 150 Hz, frequency of the target clock signal is 10 MHz, frequency of the external clock signal is 24 MHz, and the frequency-dividing modulus is 1000. Before further instruction, it is clarified that a non-linear system is taken as an embodiment for instruction; which means, the frequency adjusting unit 124 transmits the clock adjusting signal FS to the sensing clock generating unit 112 so as to gradually adjust frequency of the sensing clock signal ECS according to the number of adjustment and the step adjusting frequency.

Figure 3:
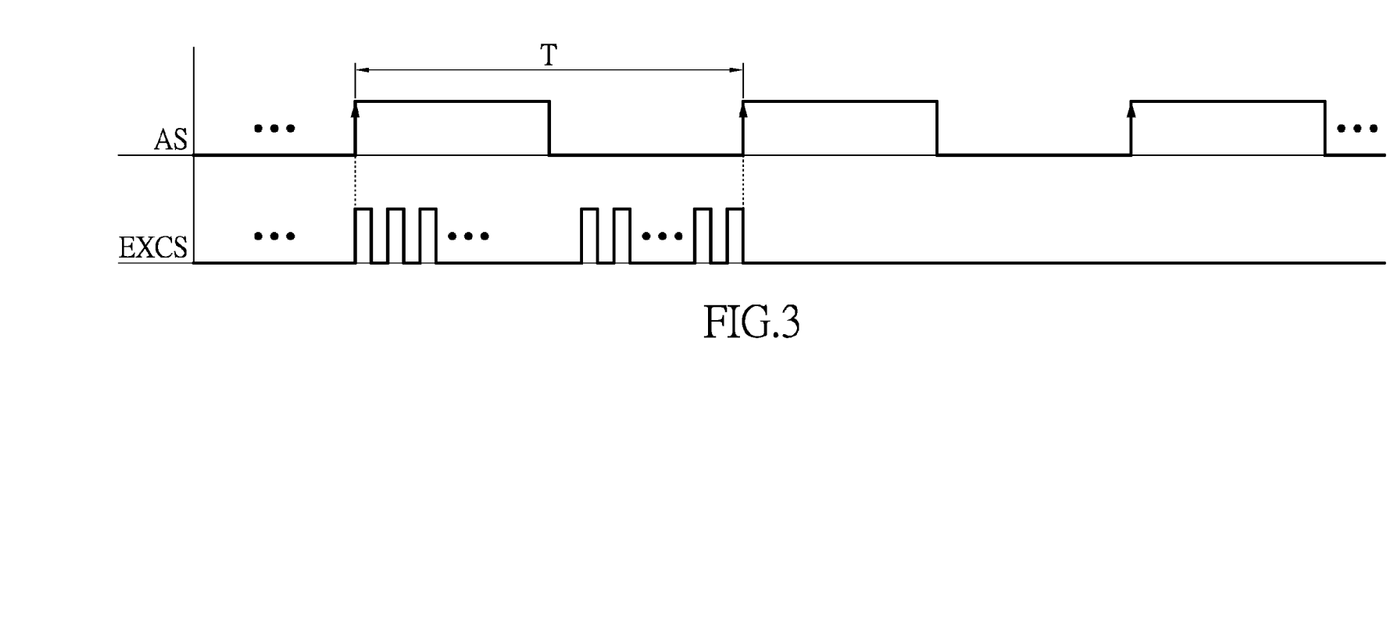
FIG. 3 shows a waveform view for the external clock signal sampling the clock calibration signal according to an embodiment of instant disclosure.

In this embodiment, assume the frequency of the sensing clock signal ECS is smaller than frequency of the target clock signal, and a frequency variation between the sensing clock signal ECS and the target clock signal is 2 MHz. In detail, the sensing clock generating unit 112 transmits the sensing clock signal ECS with frequency of 8 MHz to the frequency-dividing unit 114. At this time, the frequency-dividing unit 114 makes the frequency of the sensing clock signal ECS be divided by the frequency-dividing modulus (i.e., 1000), and then the frequency-dividing unit 114 outputs the clock calibration signal AS with frequency of 8 kHz to the period counter 122. Referring to FIG. 3 concurrently, FIG. 3 shows a waveform view for the external clock signal sampling the clock calibration signal according to an embodiment of instant disclosure. The period counter 122 proceed counting with a way of sampling within a period T. Furthermore, when the period counter 122 receives a rising edge of the clock calibration signal AS, the period counter 122 starts to count through the external clock signal EXCS having a frequency of 24 MHz sampling the clock calibration signal AS having a frequency of 8 kHz, and then ends the work of counting at the next rising edge of the clock calibration signal AS. Accordingly, in this embodiment, the period counter 122 may generate the second count value COUT2 with 3000 counts, as shown in equation (1), and the second count value COUT2 is transmitted to the frequency adjusting unit 124. Next, the frequency adjusting unit 124 may capture the first count value COUT1 from the programmable memory unit 126. In this embodiment, the calculation of the first count value COUT1 is as shown in equation (2), wherein the predetermined clock signal is 10 kHz, and the predetermined clock signal is that the frequency of the target clock signal (i.e., 10 MHz) is divided by the frequency-dividing modulus (i.e., 1000).

$$24 \text{ MHz}/8 \text{ kHz}=3000 \text{ counts} \quad \text{equation (1)}$$

$$24 \text{ MHz}/10 \text{ kHz}=2400 \text{ counts} \quad \text{equation (2)}$$

Next, the frequency adjusting unit 124 is configured to subtract reciprocal of the second count value COUT2 from reciprocal of the first count value COUT1 and then make the result be multiplied by the frequency-dividing modulus so as to acquire the frequency difference data, as shown in equation (3). Moreover, the frequency adjusting unit 124 makes frequency of the external clock signal EXCS be divided by the step adjusting frequency so as to acquire a step adjusting data, as shown in equation (4). Afterwards, the frequency adjusting unit 124 makes the equation (3) be multiplied by the equation (4) so as to acquire equation (5), wherein a number of adjustment is positive integer, i.e., 13. Under a non-linear system, the frequency adjusting unit 124 may transmits the clock adjusting signal FS to the sensing clock generating unit 112 so as to gradually adjust frequency of the sensing clock signal ECS in 13 times continuously, and then frequency of the sensing clock signal ECS will be approach to or equal to frequency of target clock signal. Accordingly, the frame rate does not vary with a variation of the sensing clock signal ECS. In one embodiment, the frame rate may be set as 1000 frames per second (fps) so as to meet design specification, i.e., the maximum speed is 10 and the maximum acceleration is 1 g. Therefore, through above-mentioned mechanism, the optical mouse may reduce power consumption.

$$1000\times[(1/2400)-(1/3000)]=2 \text{ MHz}/24 \text{ MHz} \quad \text{equation (3)}$$

$$24 \text{ MHz}/150 \text{ kHz} \quad \text{equation (4)}$$

$$(2 \text{ MHz}/24 \text{ MHz})\times(24 \text{ MHz}/150 \text{ kHz})=13.3 \quad \text{equation (5)}$$

It is worth mentioning that, in another embodiment for the linear system, after the frequency adjusting unit 124 calculating the frequency difference between the sensing clock signal ECS and the target clock signal, the frequency adjusting unit 124 may transmit the clock adjusting signal FS to the sensing unit 112 so as to once adjust frequency of the sensing clock signal ECS.

Figure 4:
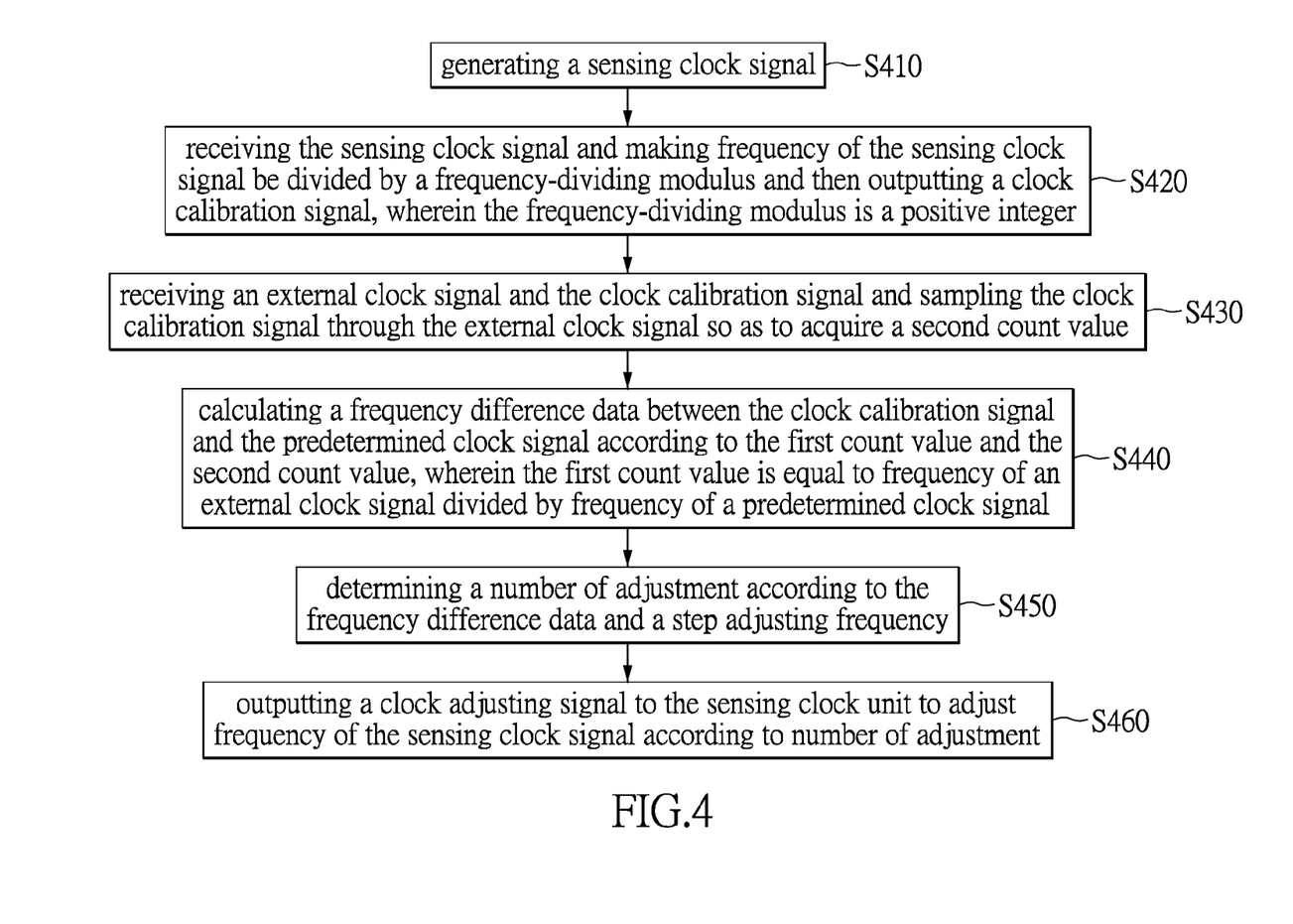
FIG. 4 shows a flow diagram of clock frequency adjusting method according to the embodiment of the instant disclosure

Referring to FIG. 4, FIG. 4 shows a flow diagram of clock frequency adjusting method according to the embodiment of the instant disclosure. The method includes steps as follows: generating a sensing clock signal (step S410); receiving the sensing clock signal and making frequency of the sensing clock signal be divided by a frequency-dividing modulus and then outputting a clock calibration signal, wherein the frequency-dividing modulus is a positive integer (step S420); receiving an external clock signal and the clock calibration signal and sampling the clock calibration signal through the external clock signal so as to acquire a second count value (step S430); calculating a frequency difference data between the clock calibration signal and the predetermined clock signal according to the first count value and the second count value, wherein the first count value is equal to frequency of an external clock signal divided by frequency of a predetermined clock signal (step S440); determining a number of adjustment according to the frequency difference data and a step adjusting frequency (step S450); and outputting a clock adjusting signal to the sensing clock unit to adjust frequency of the sensing clock signal according to number of adjustment (step S460).

Relevant details of the steps of the clock frequency adjusting method regarding the clock frequency adjusting system are described in the embodiments of FIGS. 1-3, and thus it is not repeated thereto. It is clarified that, a sequence of steps in FIG. 4 is set for a need to instruct easily, and thus the sequence of the steps is not used as a condition in demonstrating the embodiments of the instant disclosure.

To sum up, the clock frequency adjusting system and the method thereof, the sensor are able to automatically adjust internal frequency of the sensor through an external clock frequency so as to meet a predetermined frame rate corresponding to design specification, and then effectively reduce power consumption of the mouse.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A clock frequency adjusting system, comprising:
   a sensing clock generating unit, generating a sensing clock signal;
   a frequency-dividing unit, electrically connected to the sensing clock generating unit, the frequency-dividing unit receiving the sensing clock signal and making frequency of the sensing clock signal be divided by a frequency-dividing modulus and then outputting a clock calibration signal, wherein the frequency-dividing modulus is a positive integer; and
   a controller, electrically connected to the frequency-dividing unit, the controller having a first count value, wherein the first count value is equal to frequency of an external clock signal divided by frequency of a predetermined clock signal, the controller comprising:
   a period counter, electrically connected to the frequency-dividing unit, the period counter receiving the external clock signal and the clock calibration signal, and sampling the clock calibration signal through the external clock signal so as to acquire a second count value; and a frequency adjusting unit, electrically connected to the period counter, the frequency adjusting unit calculating a frequency difference data between the clock calibration signal and the predetermined clock signal according to the first count value and the second count value, and determining a number of adjustment according to the frequency difference data and a step adjusting frequency so as to output a clock adjusting signal to the sensing clock unit to adjust frequency of the sensing clock signal.

2. The clock frequency adjusting system according to claim 1, wherein the frequency adjusting unit is configured to subtract reciprocal of the second count value from reciprocal of the first count value and then make result be multiplied by the frequency-dividing modulus so as to acquire the frequency difference data, and makes frequency of the external clock signal be divided by the step adjusting frequency so as to acquire a step adjusting data.

3. The clock frequency adjusting system according to claim 2, wherein the frequency adjusting unit makes the frequency difference data be multiplied by the step adjusting data so as to acquire the number of adjustment, wherein the number of adjustment is a positive integer.

4. The clock frequency adjusting system according to claim 1, wherein the frequency adjusting unit transmits the clock adjusting signal to the sensing clock generating unit so as to once adjust frequency of the sensing clock signal according to the frequency difference data and the step adjusting frequency.

5. The clock frequency adjusting system according to claim 1, wherein the frequency adjusting unit transmits the clock adjusting signal to the sensing clock generating unit so as to gradually adjust frequency of the sensing clock signal according to the number of adjustment and the step adjusting frequency.

6. The clock frequency adjusting system according to claim 1, wherein the second count value is equal to frequency of an external clock signal divided by frequency of the clock calibration signal.

7. The clock frequency adjusting system according to claim 1, wherein the controller further comprising:
a programmable memory unit, electrically connected to the frequency adjusting unit, the programmable memory unit storing the frequency-dividing modulus, the first count value, the step adjusting frequency and the number of adjustment.

8. The clock frequency adjusting system according to claim 1, further comprising:
an image capture unit, electrically connected to the sensing clock generating unit, the image capture unit receiving the sensing clock signal and accordingly capturing a surface image, wherein the image capture unit has a predetermined frame rate, and the predetermined frame rate is corresponding to frequency of the predetermined clock signal.

9. A sensor, used for a mouse, the sensor comprising:
a sensing clock generating unit, generating a sensing clock signal;
a frequency-dividing unit, electrically connected to the sensing clock generating unit, the frequency-dividing unit receiving the sensing clock signal and making frequency of the sensing clock signal divided by a frequency-dividing modulus and then outputting a clock calibration signal, wherein the frequency-dividing modulus is a positive integer; and
an image capture unit, electrically connected to the sensing clock generating unit, the image capture unit receiving the sensing clock signal and accordingly capturing a surface image, wherein the image capture unit has a predetermined frame rate, and the predetermined frame rate is corresponding to frequency of the predetermined clock signal,
wherein the frequency-dividing unit is electrically connected to a controller, the controller has a first count value, and the first count value is equal to frequency of an external clock signal divided by frequency of a predetermined clock signal, the controller comprising:
a period counter, electrically connected to the frequency-dividing unit, the period counter receiving the external clock signal and the clock calibration signal, and sampling the clock calibration signal through the external clock signal so as to acquire a second count value; and
a frequency adjusting unit, electrically connected to the period counter, the frequency adjusting unit calculating a frequency difference data between the clock calibration signal and the predetermined clock signal according to the first count value and the second count value, and determining a number of adjustment according to the frequency difference data and a step adjusting frequency so as to output a clock adjusting signal to the sensing clock unit to adjust frequency of the sensing clock signal.

10. The sensor according to claim 9, wherein the frequency adjusting unit is configured to subtract reciprocal of the second count value from reciprocal of the first count value and then make result be multiplied by the frequency-dividing modulus so as to acquire the frequency difference data, and makes frequency of the external clock signal be divided by the step adjusting frequency so as to acquire a step adjusting data.

11. The sensor according to claim 10, wherein the frequency adjusting unit makes the frequency difference data be multiplied by the step adjusting data so as to acquire the number of adjustment, wherein the number of adjustment is a positive integer.

12. The sensor according to claim 9, wherein the frequency adjusting unit transmits the clock adjusting signal to the sensing clock generating unit so as to adjust frequency of the sensing clock signal according to the frequency difference data and the step adjusting frequency.

13. The sensor according to claim 9, wherein the frequency adjusting unit transmits the clock adjusting signal to the sensing clock generating unit so as to adjust frequency of the sensing clock signal according to the number of adjustment and the step adjusting frequency.

14. The sensor according to claim 9, wherein the second count value is equal to frequency of an external clock signal divided by frequency of the clock calibration signal.

15. The sensor according to claim 9, wherein the controller further comprising:
a programmable memory unit, electrically connected to the frequency adjusting unit, the programmable memory unit storing the frequency-dividing modulus, the first count value, the step adjusting frequency and the number of adjustment.

16. A clock frequency adjusting method, used for a clock frequency adjusting system, the clock frequency adjusting system comprising a sensing clock generating unit, a frequency-dividing unit and a controller, and the controller comprising a period counter and a frequency adjusting unit, wherein the frequency-dividing unit is electrically connected to the sensing clock generating unit, the period counter is electrically connected to the frequency-dividing unit, and the frequency adjusting unit is connected to the period counter, the clock frequency adjusting method comprising:

generating a sensing clock signal;

receiving the sensing clock signal and making frequency of the sensing clock signal be divided by a frequency-dividing modulus and then outputting a clock calibration signal, wherein the frequency-dividing modulus is a positive integer;

receiving an external clock signal and the clock calibration signal and sampling the clock calibration signal through the external clock signal so as to acquire a second count value;

calculating a frequency difference data between the clock calibration signal and the predetermined clock signal according to the first count value and the second count value, wherein the first count value is equal to frequency of an external clock signal divided by frequency of a predetermined clock signal;

determining a number of adjustment according to the frequency difference data and a step adjusting frequency; and outputting a clock adjusting signal to the sensing clock unit to adjust frequency of the sensing clock signal according to number of adjustment.

17. The clock frequency adjusting method according to claim 16, wherein the frequency adjusting unit is configured to subtract reciprocal of the second count value from reciprocal of the first count value and then make result be multiplied by the frequency-dividing modulus so as to acquire the frequency difference data, and makes frequency of the external clock signal be divided by the step adjusting frequency so as to acquire a step adjusting data.

18. The clock frequency adjusting method according to claim 17, wherein the frequency adjusting unit makes the frequency difference data be multiplied by the step adjusting data so as to acquire the number of adjustment, wherein the number of adjustment is a positive integer.

19. The clock frequency adjusting method according to claim 16, wherein the frequency adjusting unit transmits the clock adjusting signal to the sensing clock generating unit so as to once adjust frequency of the sensing clock signal according to the frequency difference data and the step adjusting frequency.

20. The clock frequency adjusting method according to claim 16, wherein the frequency adjusting unit transmits the clock adjusting signal to the sensing clock generating unit so as to gradually adjust frequency of the sensing clock signal according to the number of adjustment and the step adjusting frequency.

* * * * *